US006957967B2

(12) United States Patent
Petersen et al.

(10) Patent No.: US 6,957,967 B2
(45) Date of Patent: Oct. 25, 2005

(54) ELECTRICAL CONNECTOR WITH DIFFERENT PITCH TERMINALS

(75) Inventors: Richard W. Petersen, Chandler, AZ (US); Sung-Pei Hou, Tu-chen (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 10/805,464

(22) Filed: Mar. 19, 2004

(65) Prior Publication Data

US 2005/0208794 A1 Sep. 22, 2005

(51) Int. Cl.$^{7}$ ....................... H01R 12/00; H01R 13/62; H05K 1/00

(52) U.S. Cl. ........................................ 439/78; 439/330

(58) Field of Search .......................... 439/78, 330, 607, 439/108

(56) References Cited

U.S. PATENT DOCUMENTS 4,762,500 A * 8/1988 Dola et al. .................... 439/79
5,199,880 A * 4/1993 Arai ............................ 439/65
5,320,550 A 6/1994 Uratsuji
5,618,191 A * 4/1997 Chikano et al. ............ 439/108
6,290,515 B1 * 9/2001 Lee ............................ 439/108
6,299,492 B1 * 10/2001 Pierini et al. ............... 439/884

* cited by examiner

*Primary Examiner*—Chandrika Prasad
(74) *Attorney, Agent, or Firm*—Wei Te Chung

(57) ABSTRACT

An electrical connector (20) mounted on a substrate (**20*b*) defining holes (22) includes a base (30) and first and second terminals (62, 84) attached to the base. Each terminal has a retention portion (622) and a pair of curved arms (624, 626) extending from opposite ends of the retention portion. The pair of curved arms are respectively formed with upper and lower contact portions (623, 625). Each terminal has a securing portion (842) and upper and lower mating portions (844, 848) extending from opposite ends of the securing portion. Certain second terminals each have a bent portion (846**) to make the pitch between the lower mating portions of two adjacent second terminals larger than that between the upper contact portions of two adjacent first terminals, thereby conveniently and safely drilling the holes of the substrate in which the lower mating portions are secured.

20 Claims, 7 Drawing Sheets

ELECTRICAL CONNECTOR WITH DIFFERENT PITCH TERMINALS

BACKGROUND OF THE INVENTION

1. Field of the Invention

The present invention relates to the art of electrical connectors, and especially to a pin grid array (PGA) type socket connector for electrically interconnecting an integrated circuit (IC) with a printed circuit board (PCB).

2. Description of the Prior Art

Conventionally, a PGA-type socket connector comprises a plurality of conductive terminals inserted into corresponding holes of a PCB, thereby to achieve electrical engagement between the socket connector and the PCB. With the trend toward miniaturization of electrical components, the density of the terminals arrayed in the socket connector becomes more and more high to catch up with the trend. This results increasing the density of the holes to secure the terminals, namely, a pitch of two adjacent holes in the PCB in a row or column is relatively small or short. Thus, it is increasingly difficult to drill such holes in the PCB and the risk of wastage of the drilled PCB is accordingly prone to increase.

Referring to FIGS. 14 and 15, a typical socket connector 90 comprises a plurality of terminals 92 for electrically interconnecting an IC (not shown) with a wire board 98. A tail 920 is formed at a distal end of each terminal 92 and adapted to insert into a corresponding hole 980 of the wire board 98, thereby electrically bridging the socket connector 90 and the wire board 98. With the trend toward high density of the terminals 92 arrayed in the socket connector, the holes 980 of the PCB 980, which are used to receive the terminals, must be devised to cater for the trend. As a result, the distance between two adjacent holes 980 in a row is more and more short. Thus, it becomes increasingly difficult to drill such a hole in the wire board 98 without damage to its adjacent holes 980. This increases the risk of wastage of the wire boards 98 and manufacturing costs are accordingly sharply climbed up. U.S. Pat. No. 5,320,550, assigned to Yamaichi and issued on Jun. 14, 1994, discloses a similar socket connector with the same shortcomings above-stated.

Accordingly, a new electrical connector that solves the above problems is desired.

SUMMARY OF THE INVENTION

Accordingly, an object of the present invention is to provide an electrical connector with different pith terminals, thereby to increase a pitch of two adjacent holes defined in a PCB in which corresponding terminals of the electrical connector are secured, so that the holes can conveniently and safely be drilled in the PCB and manufacturing costs required to form the PCB can be saved.

To fulfill the above object, an electrical connector is applied according to the present invention. The electrical connector comprises a base, a first module received in the base, and a second module immovably attached to a bottom of the base. The first module comprises a housing and a plurality of first terminals secured in the housing in rows and columns. Each first terminal comprises a middle portion and upper and lower curved resilient arms extending from opposite ends of the middle portion. The upper and lower curved resilient arms are respectively formed with a finger and a leg. The second module comprises a substrate and a plurality of second terminals secured on the substrate. Each second terminal comprises a middle section, an upper mating portion extending from an end of the middle section and adapted to mechanically and electrically engage the leg of a corresponding first terminal, and a lower connecting portion extending from an opposite end of the middle section and adapted to be accommodate in a hole defined in a PCB. The middle section of at least one of the second terminals comprises a portion bent to offset the lower connecting portion of said at least one of the second terminals away from the upper mating portion of said at least one of the second terminals, so that fingers of two adjacent first terminals that mechanically and electrically engage two corresponding second terminals form a pitch less than that defined between two holes that electrically mate with said two corresponding second terminals. As a result, it is convenient and safe to drill or the like to define the holes in the PCB and manufacturing costs required to form the PCB is saved.

Other objects, advantages and novel features of the present invention will become more apparent from the following detailed description when taken in conjunction with the accompanying drawings, in which:

DESCRIPTION OF PREFERRED EMBODIMENT OF THE INVENTION

Reference is now made to the drawings to describe the invention in detail.

The electrical connector 20 applied according to the present invention is mainly used for electrically interconnecting an IC, such as a central processing unit (CPU) 20*a*, and an electrical substrate, such as a PCB 20*b*. It should be understood that the electrical connector 20 disclosed hereinafter may be used in other circumstances, such as in an event where an IC is tested by the electrical connector 20 mounted on a test board in high work temperature and voltage.

Figure 1:
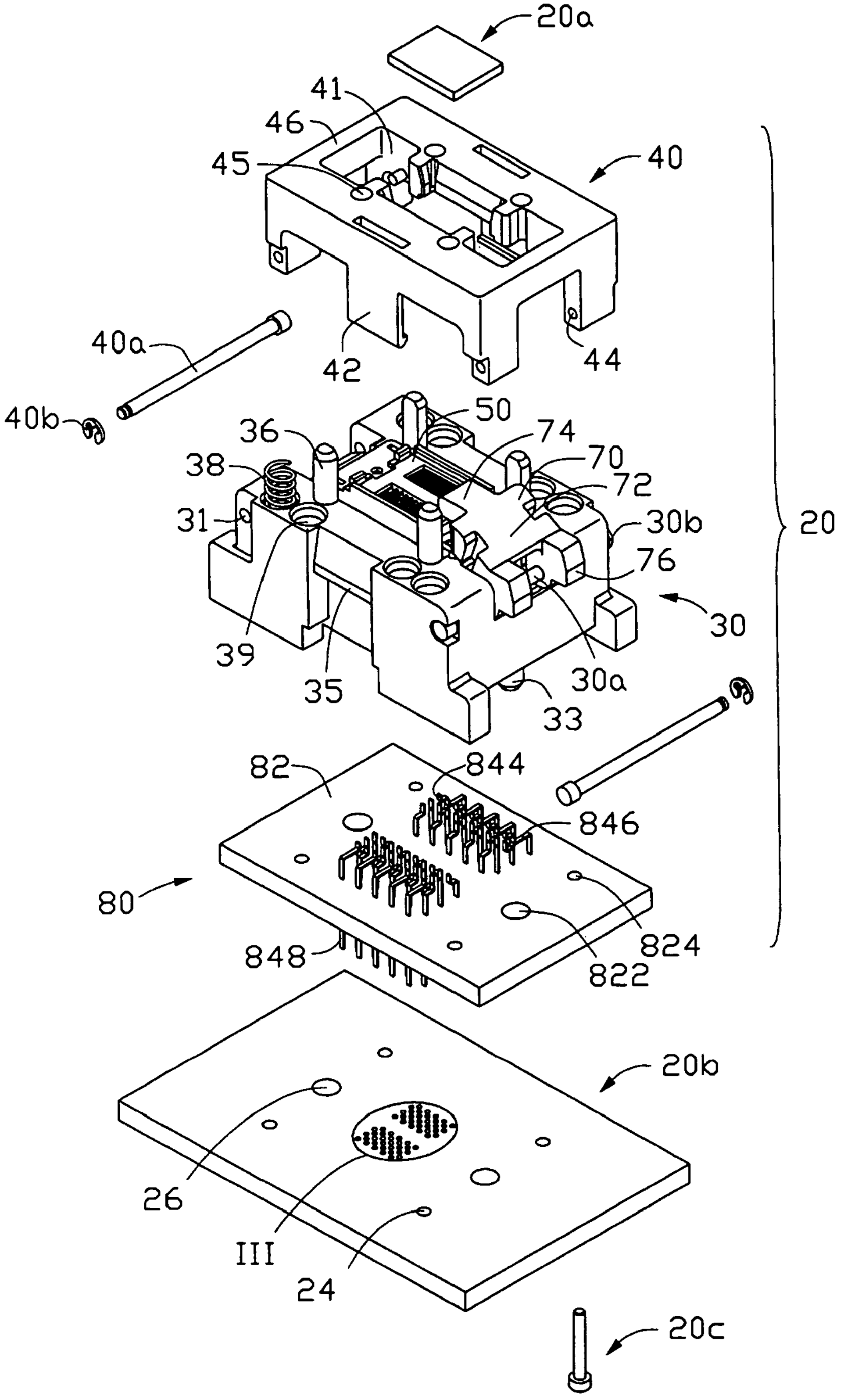
FIG. 1 is an exploded, isometric view of an electrical connector according to the present invention, together with a PCB and a CPU both ready to engage the electrical connector.
Figure 5:
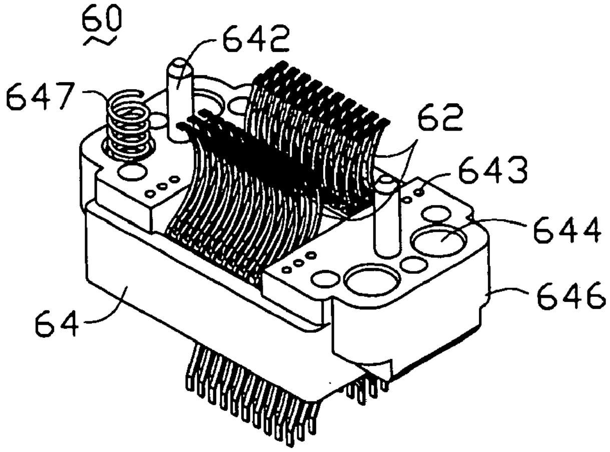
FIG. 5 is an isometric view of a first module of the electrical connector.

Referring to FIGS. 1 and 5, the electrical connector 20 includes a base 30, a lid 40 movably mounted on the base 30, a first module 60 received in the base 30, a cover 50 movably mounted on the first module 60, a second module 80 immovably attached to a bottom of the base 30 and a positioning mechanism 70 pivotally attached to the base 30.

Figure 11:
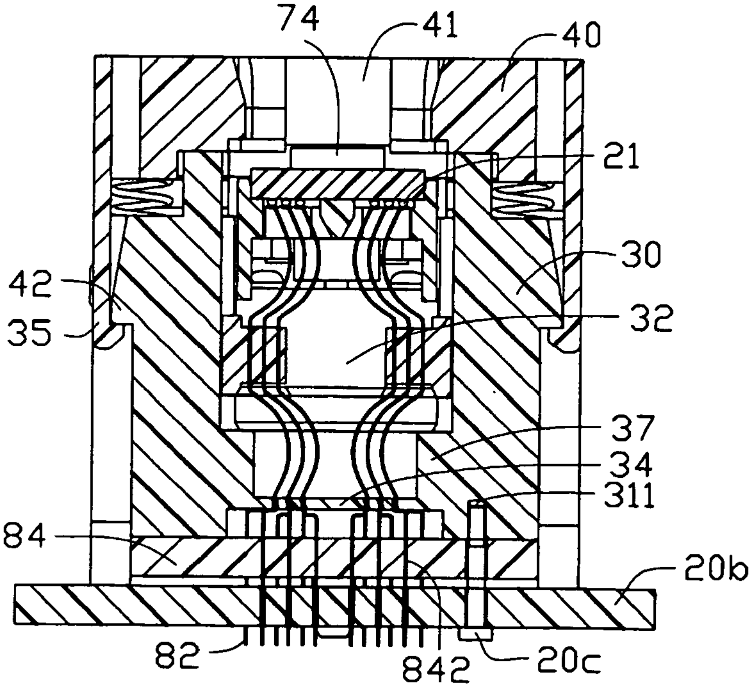
FIG. 11 is a cross sectional view along a directed line XI—XI in FIG. 10.

Referring also to FIG. 11, the base 30 is formed from dielectric material and defines a chamber 32 for accommodating the first module 60. Formed in the chamber 32 is supporting blocks 37, the blocks 37 cooperatively define a common horizontal top surface to support the first module 60 in the chamber 32. The lid 40 is formed from dielectric material and defines a rectangular window 41 through which the CPU 20*a* can be inserted.

Best illustrated in FIG. 1, there is latching means applied on the lid 40 and the base 30 for holding the lid 40 on the base 30. Said latching means may be any conventional structures. In the present invention said latching means includes a cantilever 42 extending downwardly from a flank of the lid 40 and formed with a hook and a latching block 35 extending outwardly from a side of the base 30. The hook can snap on the latching block 35 to latch the lid 40 on the base 30 (best illustrated in FIG. 11). Additionally, urging means is applied between the lid 40 and the base 30 for urging the lid 40 to move away from the base 30. The urging means includes spring coils 38 received in recesses 39 defined in the base and recesses defined in the lid 40 (not shown). The spring coils 38 are in a compressed state as the lid 40 is latched on the base 30. The latching means and the urging means cooperatively restrain the lid 40 to move up and down on the base 30.

In order to guide the lid 40 to move relative to the base 30, a guiding system is defined on the lid 40 and the base 30. The guiding system includes two pairs of guiding posts 36 extending upwardly form a top surface of the base 30 and two pairs of guiding holes 45 defined in the lid 40. The guiding posts 36 can be inserted into corresponding guiding holes 45 thereby to guide the lid 40 to move relative to the base 30.

Referring to FIGS. 5, 6, 7, 8 and 9, the first module 60 includes a housing 64 and two same first terminal modules over-molded on the housing 64. It should be understood that the first terminal modules may be mechanically mounted on the housing 64 or the like. A substantially rectangular cavity 645 is defined in the housing 64. The two first terminal modules are mirroredly oriented in the cavity 645 of the housing 64. Each first terminal module includes three same sub-first terminal modules 66. Each sub-first terminal module 66 includes a dielectric carrier 68 and a row of first terminals 62 molded on the carrier 68. It should also be understood that the first terminals 62 may be mechanically interveningly mounted in recesses defined in the carrier 68 (not shown). A plurality of molding holes 682, 684 is defined in the carrier 68, for the carriers 68 of all the sub-first terminal modules 66 being firmly molded together with the housing 64.

Figure 7:
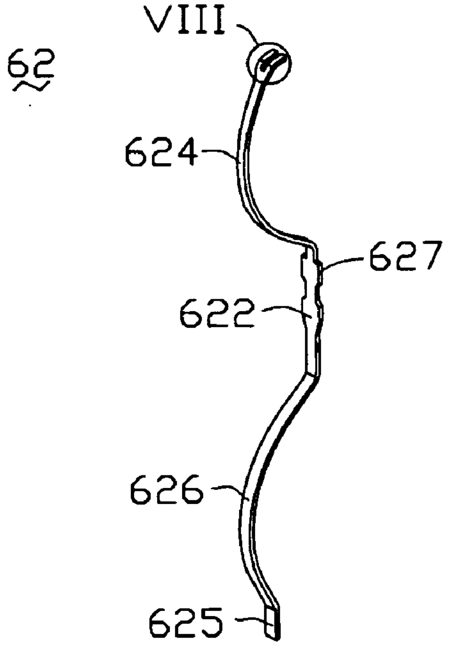
FIG. 7 is an isometric view of a first terminal of the electrical connector.
Figure 8:
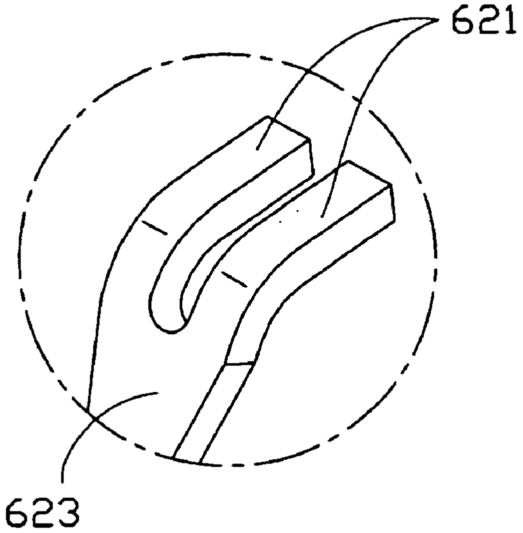
FIG. 8 is an enlarged view of a circled part VIII in FIG. 7.

Best illustrated in FIGS. 7 and 8, each first terminal 62 includes a vertical retention body 622, upper and lower resilient arms 624, 626 extending substantially perpendicularly from opposite ends of the retention body 622 away from each other. Barbs 627 are formed at opposite lateral sides of the retention body 622, for facilitating securing the first terminal 62 on the carrier 68 after molding. The upper and lower resilient arms 624, 626 each have a curved configuration so as to enhance resilient characteristics of the first terminal 62, and are mirroredly oriented with respect to the retention body 622. The upper resilient arm 624 is formed with a substantially horizontal finger 623 for electrically attaching to a corresponding conductive member formed on the CPU 20*a*, such as a soldering ball 21. In order to facilitating contacting of the finger 623 with the soldering ball 21, the finger 623 has a substantially horizontal configuration formed with two bifurcated arms 621 for supporting the soldering ball 21. A leg 625 extends perpendicularly and downwardly from a distal end of the lower resilient arm 626.

Figure 6:
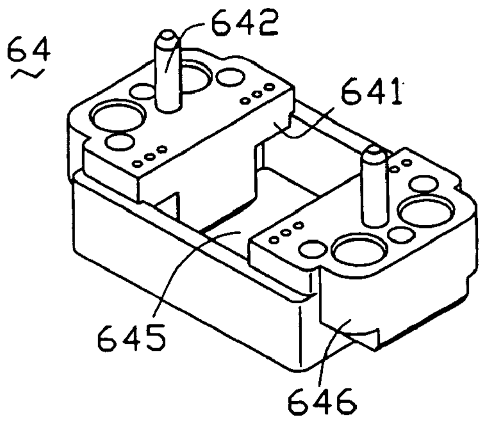
FIG. 6 is an isometric view of a housing of the first module.
Figure 9:
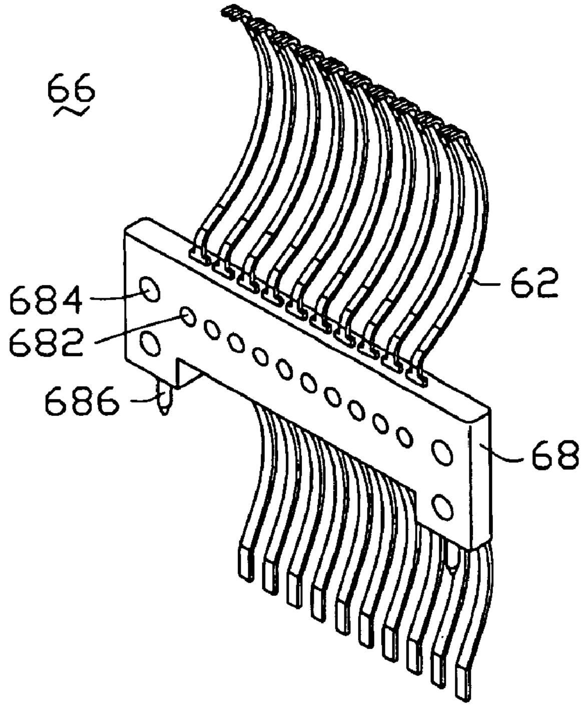
FIG. 9 is an isometric view of a sub-first terminal module of the first module.

Best illustrated in FIGS. 6 and 9, in order to pre-fix each sub-first terminal module 66 into the cavity 645 of the housing 64 before molded on the housing 64, a fixing mechanism is incorporated on the carrier 68 of the sub-first terminal module 66 and the housing 64. The fixing mechanism has a pair of extending portions 686 extending from a bottom surface of the carrier 68 and fixing holes 643 defined in the housing 64. Engaging of the extending portions 682 in the fixing holes 643 facilitates pre-positioning the sub-first terminal module 66 on the housing 64 prior to molding the sub-first terminal module 66 on the housing 64.

After all the sub-first terminal modules 66 are fixed on the housing 64, a molding process is applied to mold all the sub-first terminal modules 66 on the housing 64 integrally.

Figure 4:
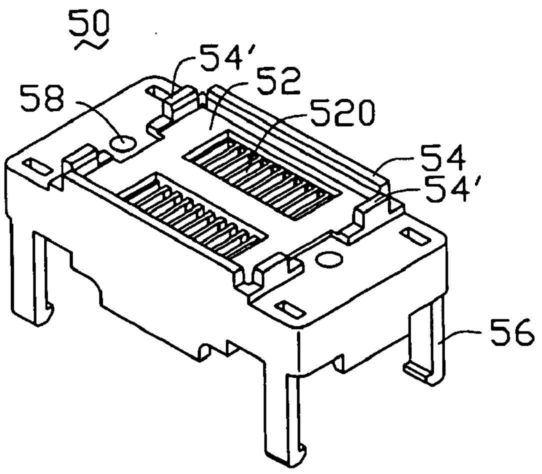
FIG. 4 is an isometric view of a cover of the electrical connector.

Referring to FIG. 4, in order to facilitate electrical engagement of the CPU 20*a* with the fingers 625 of the first terminals 62, the cover 50 is equipped and movably mounted on the housing 64 for securing the CPU 20*a* thereon. The cover 50 is restrained on the housing 64 by guiding mechanism 642, 58, urging mechanism 647 and latching mechanism 56, 646 which are almost same to the guiding means, the urging means and the latching means incorporated in the lid 40 and the base 30, respectively, needless to elaborate said guiding, urging and latching mechanisms. The cover 50 is formed with a rectangular supporting ceiling 52 and side walls 54, 54' extending upwardly from four edges of the supporting ceiling 52. The supporting ceiling 52 and the side walls 54, 54' cooperatively defines a room for accommodating and positioning the CPU 20*a*. Further. A sliding slant surface is formed on each of the side walls 54, 54', for facilitating insertion of the CPU 20*a*. Two rows of slots 520 are defined in the supporting ceiling 52, corresponding to the fingers 625 of the first terminals 62.

Figure 10:
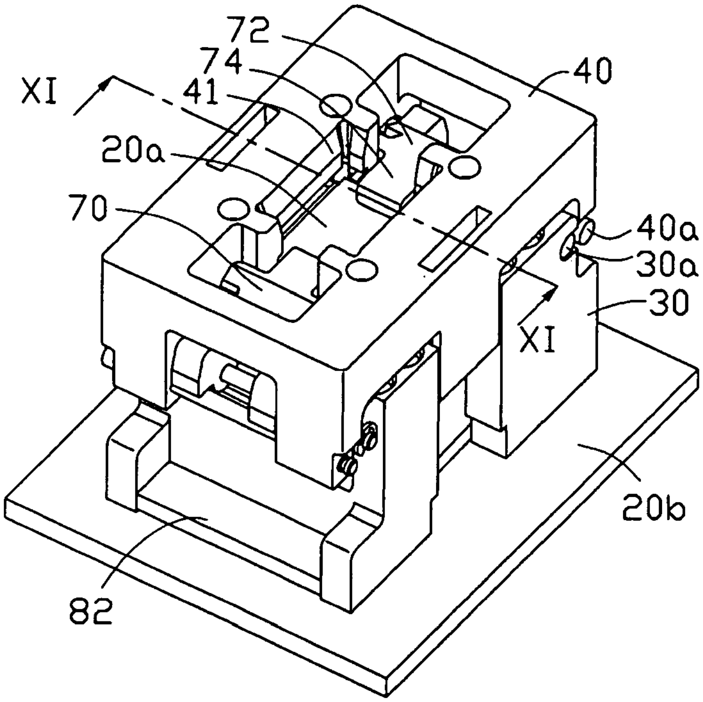
FIG. 10 is an assembled, isometric view of FIG. 1.

Referring to FIGS. 1 and 10, a positioning mechanism 70 is supplied to further secure the CPU 20*a* on the cover 50 after the CPU 20*a* is mounted on the cover. The positioning mechanism 70 has a body 72, a pressing head 74 extending from one side of the body 72 and two extending tails 76 extending from an opposite side of the body 72. A bore is defined in each extending tail (not labeled), adjacent the body 72.

Referring to FIGS. 1, 2, 3 and 11, the second terminal module 80 includes a plate-like substrate 82 and two same groups of second terminals 84 mirroredly molded on the substrate 82. It should also be understood that the second terminals 84 may also mechanically interveningly in holes defined in the substrate 82 or the like. Each second terminal 84 is stamped from a sheet of conductive material and includes a securing portion 842 vertically molded in the substrate 82, an upper mating portion 844 extending upwardly from one end of the securing portion 842 and a lower connecting portion 848 extending downwardly from an opposite end of the securing portion 842.

Figure 2:
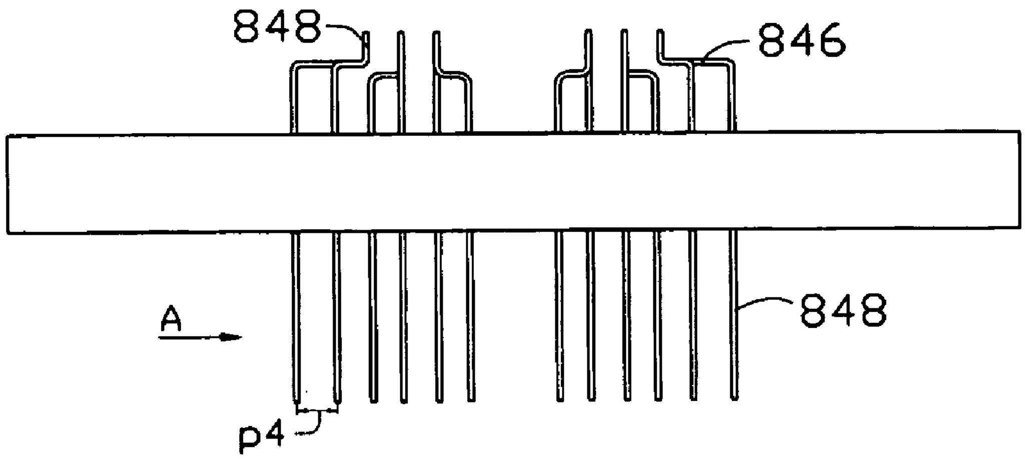
FIG. 2 is a front view of the PCB shown in FIG. 1.

Best illustrated in FIGS. 1 and 2, in the left group of second terminals 84, the upper mating portions 844 and the lower connecting portions 848 of the group of second terminals 84 are arrayed in rows and columns parallel to each other. The upper mating portions 844 are arrayed in three rows (designated r1, r2 and r3 along arrow A), and the lower connecting portions 848 are arrayed in six rows (designated 11, 12, 13, 14, 15 and 16 along arrow A). The second terminals 84 in 11, 12, 13 and 16 each are formed with a bent portion 846. The bent portion 846 generates an offset distance of said second terminal 84' lower connecting portions 848 correspondingly with respect to said second terminal 84' upper mating portion 844 along the direction of opposing to arrow A, except for 16 along arrow A.

The offset distance of any bent portion 846 in 12 is dimensioned to equal a row or column pitch of any two adjacent upper mating portions 844 in a row or column, and is equal to that of 13, 16, and half as long as that of 11. It should be understood that the offset distances of the bent portions 846 in 11, 12, 13 and 16 may be set at different desired values to meet different demands.

Furthermore, r1 corresponds to 11 and 12, r2 to 13 and 14, and r3 to 15 and 16. The upper mating portions 844 corresponding to 11 are staggerly arrayed with the upper mating portions 844 corresponding to 12. With each bent portion 846 in 11 being double offset relative to each bent portion 846 in 12 along the direction of opposing to Arrow A, 11 offsets a distance (equal to p4 in FIG. 2) away from 12 along said direction.

L3 offsets a distance (equal to p4 in FIG. 2) away from 12 along Arrow A, the upper mating portions 844 corresponding to 13 are also staggerly arrayed with the upper mating portions 844 corresponding to 14. Since 14 doest not offset and 13 offset a distance (equal to p4 in FIG. 2) away form 14 along said direction, between 13 and 14 exits a span that equals to the distance.

L5 offsets a distance (equal to p4 in FIG. 2) away from 14 along Arrow A, the upper mating portions 844 corresponding to 15 are staggerly arrayed with the upper mating portions 844 corresponding to 16. Since 15 doest not offset and 16 offset a distance (equal to p4 in FIG. 2) away form 15 along Arrow A, 16 is spanned a length that equals to the distance away from 15.

Additionally, the lower connecting portions 848 in 11, 13 and 15 are aligned with each other along arrow A, and the lower connecting portions 848 in 12, 14 and 16 are also aligned with each other along arrow A.

With the configuration and arrangement of the second terminals 84, a pitch of any two adjacent upper mating portions 844 in a row equals to a pitch of any two adjacent upper mating portions 844 in a column, and is half as long as that of any two adjacent lower connecting portions 848 in a row or column.

Referring to FIGS. 1, 10 and 11, in assembly, the urging mechanism 647 is embedded between the cover 50 and the housing 64 of the first module 60. The cover 50 is placed on the housing 64 of the first module 60, guiding by the guiding mechanism 58, 642, until restrained by the latching mechanism. After that, the fingers 623 of the first terminals 62 is received in corresponding slots 520 of the cover 50, but not extending beyond the top surface of the supporting ceiling 52 of the cover 50.

The first module 60 is placed and secured in the chamber 32 of the base 30. In order to facilitate positioning the legs 625 of the first terminals 62, a plate like spacer 34 is formed in the chamber 32 of the base 30, defining a plurality of engaging holes 340 for receiving the legs 625 therein.

The positioning mechanism 70 is attached to the base 30 by a positioning shaft 30*a* inserted through the bores of the extending tails 76 of the positioning mechanism 70 and corresponding holes defined in the base 30 and a resilient clip 30*b* secured the inserting end of the positioning shaft 30*a*. With this assembly of the positioning mechanism 70, the body 72 of the positioning mechanism 70 can rotate round the shaft 30*a*.

The urging means 38 is attached on the base 30 and the lid 40, the lid 40 is then shifted down and guided by the guiding means 36, 45 until the latching means 42, 35 starts to function on the lid 40. A shaft 40*a* is provided to associate the lid 40 with the positioning mechanism 70. The shaft 70 is inserted in holes 44 defined in the lid 40 and secured therein by a securing member such as a fastening clip 40*b*. The extending tails 76 of the positioning mechanism 70 are abutted against a part of the shaft 40*a*, thereby establishing mechanical connection therebetween.

Additionally, in order to facilitate insertion of the first and second terminals 62, 84 into the engaging holes 340, a pair of slant surfaces 342, 344 is formed in the spacer 34 at opposite sides of each engaging hole 340.

During said insertion of the second terminals, the top of the upper mating portion 844 of the second terminal 84 is abutted against the distal part of the lower resilient arm 626, thereby to attain firm mechanical and electrical interconnection therebetween.

Figure 13:
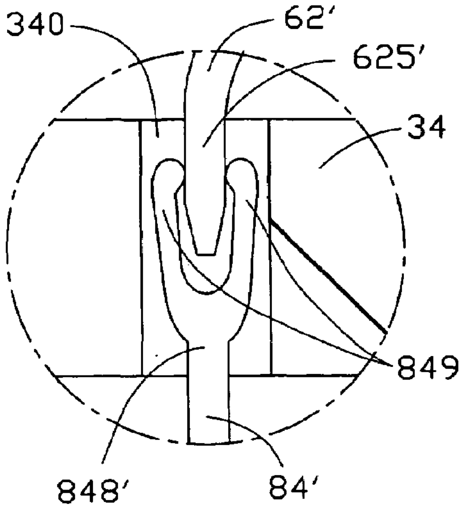
FIG. 13 is a simplified, diagrammatic cross sectional view of alternative mating of an upper mating portion of a second terminal with a leg of a corresponding first terminal.
Figure 14:
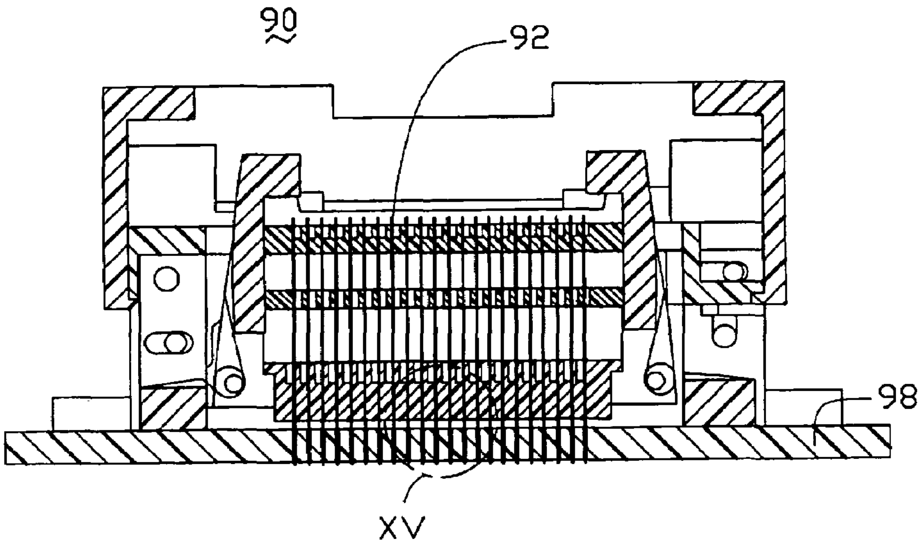
FIG. 14 (PRIOR ART)
FIG. 14 is a cross sectional view of a conventional socket connector.
Figure 15:
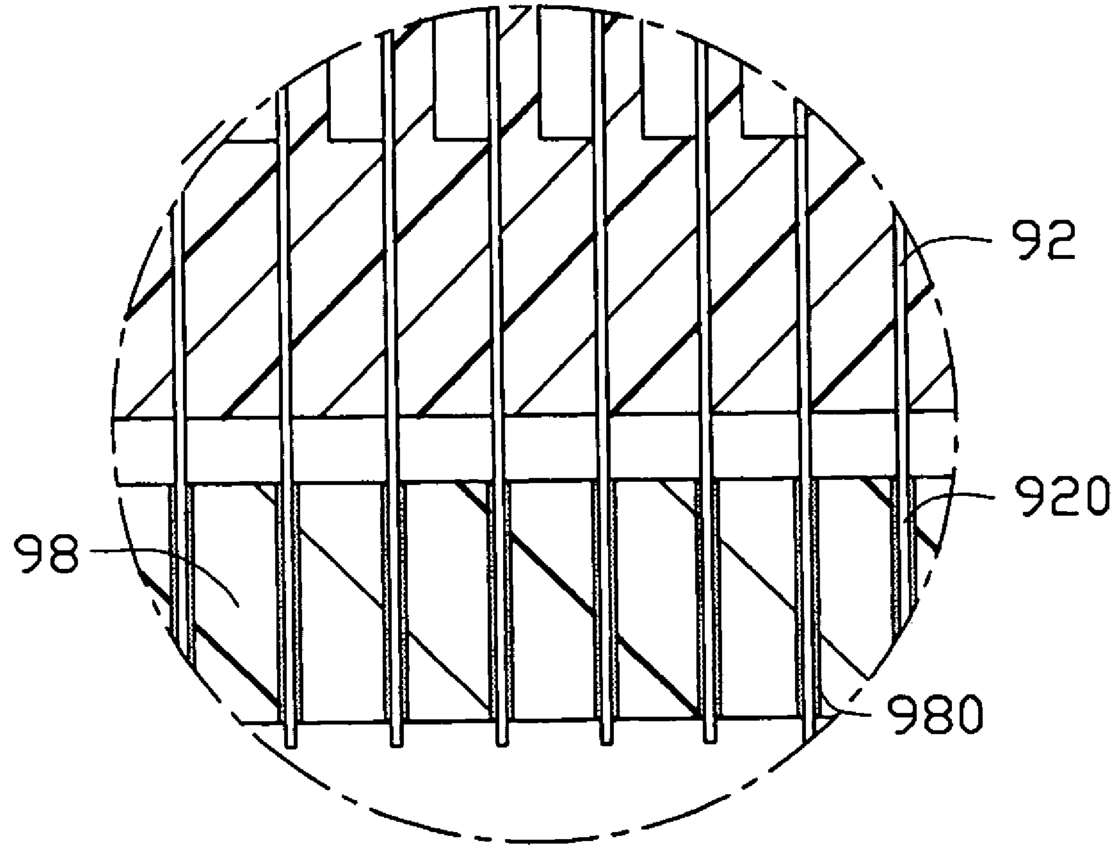
FIG. 15 (PRIOR ART)
FIG. 15 is an enlarged view of a circled part XV in FIG. 14.

It should be understood that electrical engagement between the legs 625 and the upper mating portions 844 may be various. Referring to FIGS. 11 and 13, an alternative electrical engagement is best illustrated in FIG. 13, the upper mating portions 844' each have a bifurcated configuration with two separated resilient contacting arms 849. Two contacting parts 847 are respectively formed on the two contacting arm 849 and have a span therebetween less than the width of a corresponding leg 625. During mounting the second module 80 on the base 30, the two contacting arms 849 touch the corresponding leg 625 and resiliently deform outwardly until the leg 625 fully extends between the two contacting arms 849 and attains electrical engagement between the contacting parts 847 and the leg 625. With the configuration of the second terminals 84, the spacer 34 formed in the chamber 32 of the base 30 may be omitted.

Figure 3:
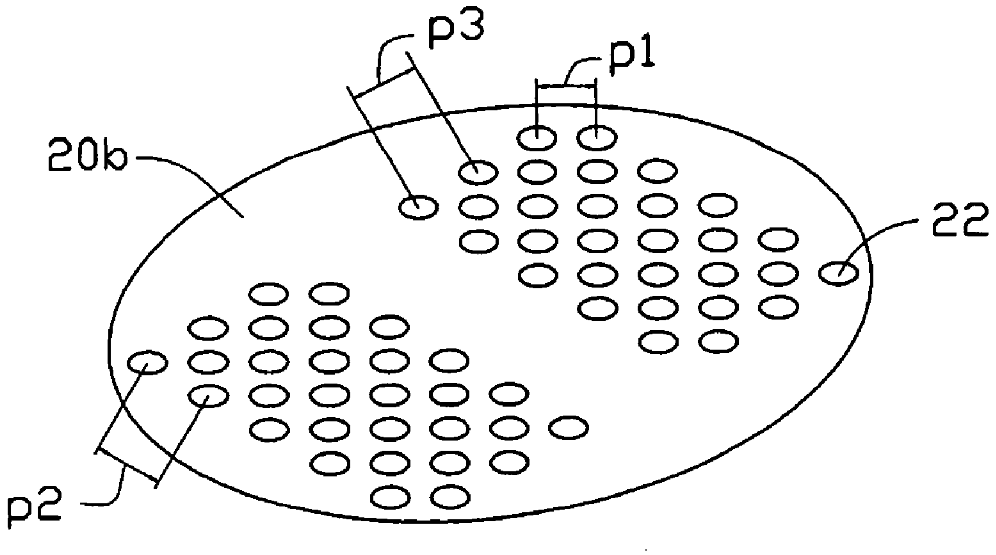
FIG. 3 is an enlarged view of a circled part III in FIG. 1.

Referring to FIGS. 1, 3 and 11, after assembly of the electrical connector 20, the electrical connector 20 is mounted on the PCB 20*b*. A plurality of holes 22 is defined in the PCB 20*b* for accommodating corresponding lower connecting portions 848 therein, thereby to establishing electrical connection between the electrical connector 20 and the PCB 20*b*. Since the holes 22 are arrayed to cater for the lower connecting portions 848, a row or column pitch p2 or p3 of two adjacent holes in a row or column is correspondingly same to the row or column pitch of the lower connecting portions 848. As a result, the row or column pitch of the upper mating portions 844, namely, a row or column pitch of two adjacent fingers 623 in a row or column, is half as long as the row or column pitch p2, p3 of the holes. The smallest diagonal pitch p1 of two adjacent holes 22 is $\sqrt{2}$ times larger or longer than the row or column pitch of the upper mating portions 844. With the relative high density of conductive members of the CPU 20*a* that electrically interconnect with the fingers 623, the density of the holes 22 of the PCB 20*b* can be maintained at a relative low lever. Thus, it is relative convenient and easily to drill or the like the holes 22 in the PCB 20*b* and manufacturing costs required to manufacture the PCB 20*b* is accordingly decreased.

Figure 12:
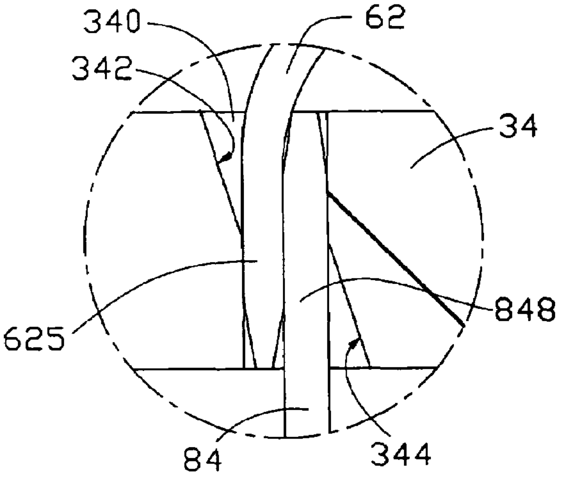
FIG. 12 is a simplified, diagrammatic cross sectional view of mating an upper mating portion of a second terminal with a leg of a corresponding first terminal.

Referring to FIGS. 1, 11 and 12, in order to secure insertion of the upper mating portions 844 of the second terminals 84 into corresponding engaging holes 340 to mate with the legs 625 of the first terminals 62 and align the lower connecting portions 848 with the holes 22 of the PCB 20*b*, positioning apertures 822 and positioning holes 26 are respectively defined in the substrate 82 the PCB, for receiving corresponding positioning posts 33 extending perpendicularly from the bottom of the base 30, thereby to assure nicety engagement between the upper mating portions 844 and the legs, and between the lower connecting portions 848 and the holes 22. Screws 20*c* are applied to insert through screwing holes 24 defined in the PCB 20*b* and screwing apertures 824 defined in the substrate 82 and engage in screwing engaging holes 311 defined in the bottom of the base 30, thereby to lock the PCB 20*b*, the second module 80 and the base 30 together.

Referring to FIGS. 1, 10 and 11, in use, a force is applied to press the lid 40 down, two opposite lateral wall 46 of the lid 40 press the extending tails 76 and urge the body 72 of the positioning mechanism 70 rotate round the positioning shaft 40*a*. The pressing heads 74 are lifted up until the CPU 20*a* can be placed and positioned in the room of the cover 50. Said force is removed. The urging means 38 presses the lid 40 up relative to the base 30, the shafts 40*a* lift the extending tails 76 to rotate the body 72 back to press the CPU 20*a* move down. The cover 50 is simultaneously pressed down. At the same, the urging mechanism 647 prevents the cover moving down. The fingers 623 are exposed beyond the top surface of the supporting ceiling 52 to mate with the soldering balls 21 as the cover 50 is balanced. Thus, electrical engagement between the CPU 20*a* and the PCB 20*b* by the electrical connector 20 is attained.

Furthermore, although the present invention has been described with reference to particular embodiment, it is not to be construed as being limited thereto. Various alterations and modifications can be made to the embodiment without in any way departing from the scope or spirit of the present invention as defined in the appended claims.

What is claimed is:

1. An electrical connector for electrically interconnecting an electrical device having a plurality of conductive members with a substrate defining a plurality of holes, the electrical connector assembly comprising:

a dielectric housing;

a plurality of first terminals secured on the housing in rows parallel to each other, each of the first terminals comprising a middle portion secured on the housing, a contact portion extending upwardly from one end of the middle portion for engaging a corresponding conductive member, and a connecting portion extending downwardly from an opposite end of the middle portion; and a plurality of second terminals secured on the housing, each of the second terminals comprising a middle section secured on the housing, a mating portion extending from one end of the middle section and being adapted to mechanically and electrically engage the connecting portion of a corresponding first terminal, and a mounting portion extending from an opposite end of the middle section to be received in a corresponding hole of the substrate;

wherein the middle section of at least one of the second terminals comprises a portion bent to offset the mounting portion of said at least one of the second terminals away from the mating portion of said at least one of the second terminals, so that contact portions of two adjacent first terminals that mechanically and electrically engage two corresponding second terminals are distanced a pitch less than that defined between two holes that electrically mate with said two corresponding second terminals.

2. The electrical connector of claim 1, wherein the portion is bent in a surface perpendicular to an extending direction of the rows.

3. The electrical connector of claim 1, wherein the middle portion of the first terminal comprises a retention portion and upper and lower curved arms extending from opposite ends of the retention portion.

4. The electrical connector of claim 3, wherein the retention portion forms barbs at opposite lateral sides thereof.

5. The electrical connector of claim 3, wherein the contact portion is formed at a distal end of the upper curved arm and has a horizontal configuration with two bifurcated arms and the connecting portion extends from a distal end of the lower curved arm.

6. The electrical connector of claim 1, wherein the housing defines a cavity and forms a horizontal spacer in the cavity, the spacer defining a plurality of cells.

7. The electrical connector of claim 6, wherein the first and second terminals are respectively oriented in the cavity and at opposite sides of the spacer and the mating portions and the connecting portions are accommodated correspondingly in the cells of the housing.

8. A contact assembly for an electrical connector comprising a frame, the contact assembly comprising:

a plurality of first contacts being arrayed on the frame in rows parallel to each other, each of the first contacts comprising a retention portion vertically secured in the frame, an upper resilient arm slantwise and upwardly extending from one end of the retention portion and formed with a substantially horizontal contact portion at a distal end thereof, a lower arm extending downwardly from an opposite end of the retention portion and formed with a connecting portion at a distal end thereof; and a plurality of second contacts mounted on the frame, each of the second contacts comprising a securing portion mounted in the frame, a mating portion extending upwardly from one end of the securing portion and adapted to mechanically and electrically engage a corresponding connecting portion, and a mounting portion downwardly from an opposite end of the securing portion;

wherein the mating portions and the mounting portions of the second contacts are arrayed in rows parallel to each other, respectively, one row of mating portions comprising the second contacts whose mounting portions are divided into at least two rows, the mating portions corresponding to the mounting portions in one of said at least two rows are staggerly arrayed with the mating portions corresponding to the mounting portions in the remaining rows, respectively, so that the mounting portions of two adjacent second contacts form a pitch therebetween larger than that defined between the mating portions of said two adjacent second contacts.

9. The contact assembly of claim 8, wherein the upper and lower arms each have a curved configuration.

10. The contact assembly of claim 9, wherein the retention portion forms barbs at opposite lateral sides thereof.

11. The contact assembly of claim 8, wherein the mating portion has a substantially horizontal configuration with two bifurcated arms.

12. An electrical connector assembly for electrically interconnecting an electrical device with an electrical substrate comprising:

a dielectric base;

a lid movably mounted on the base;

a module mounted on the base and comprising a housing immovably secured on the base and a plurality of terminals secured on the housing in rows parallel to each other, each of the terminals comprising a middle part, upper and lower engaging portions extending from opposite ends of the middle part;

a cover movably mounted on the housing for supporting the electrical device;

positioning means pivotally mounted on the base and attached to the lid for securing the electrical device on the cover; and a contact module mounted on the base and comprising a dielectric mounting plate and a plurality of contacts secured on the mounting plate, each of the contacts comprising a retention portion secured on the mounting plate, an upper mating portion extending from one end of the retention portion, and a lower mating portion extending from an opposite end of the retention portion and adapted to electrically attach to the electrical substrate;

wherein the upper mating portions and the lower mating portions of the contacts are respectively arrayed in rows and the contacts corresponding to at least one row of the lower mating portions each define an offset portion to make the pitch between any two adjacent lower mating portion larger than that between any two adjacent upper mating portions.

13. The electrical connector assembly of claim 12, wherein the middle part comprises a retention portion and a pair of curved arms extending from opposite ends of the retention portion.

14. The electrical connector assembly of claim 13, wherein the retention portion forms barbs at opposite lateral sides thereof.

15. The electrical connector assembly of claim 12, wherein the upper mating portion has a substantially horizontal configuration with two bifurcated arms.

16. The electrical connector assembly of claim 12, wherein the base defines a cavity and forms a horizontal spacer in the cavity, the spacer defining a plurality of cells.

17. The electrical connector assembly of claim 16, wherein the terminals and the contacts are respectively oriented in the cavity and at opposite sides of the spacer and the upper mating portions and the lower engaging portions are accommodated correspondingly in the cells.

18. The electrical connector assembly of claim 12, where the terminals are molded integratedly onto the housing.

19. The electrical connector assembly of claim 12, wherein one row of upper mating portions corresponds to at least one row of lower mating portions.

20. An electrical connector assembly comprising:

an printed circuit board;

a dielectric base located above said printed circuit board;

a lid moveable mounted to the base;

a first terminal module positioned in the base with a plurality of first terminals thereof;

an electronic device located above the terminal module and under the lid, and defining a plurality of first conductors in electrical engagement with the first terminals;

a biasing device forcing the lid away from the base while pressing the electronic device against the first terminals; and a second terminal module sandwiched between the printed circuit board and the base and including a plurality of second terminals, upper sections of the second terminals compliantly engaged lower sections of the corresponding first terminals, respectively, lower sections of the second terminals mechanically and electrically connected to second conductors of the printed circuit board; wherein a pitch of said first conductors is smaller than that of the second conductors, and said first terminals and said second terminals perform a transition function for pitch alternation between the first conductors and the second conductors.

* * * * *